(12) United States Patent
Roy

(10) Patent No.: US 6,292,427 B1
(45) Date of Patent: Sep. 18, 2001

(54) HIERARCHICAL SENSE AMP AND WRITE DRIVER CIRCUITRY FOR COMPILABLE MEMORY

(75) Inventor: Richard S. Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/689,352

(22) Filed: Oct. 12, 2000

(51) Int. Cl.$^7$ ................................. G11C 8/00; G11C 5/06
(52) U.S. Cl. .................. 365/230.03; 365/63; 365/205; 365/208
(58) Field of Search .................. 365/205, 207, 365/208, 51, 63, 230.03

(56) References Cited

U.S. PATENT DOCUMENTS

| | | | |
|---|---|---|---|
| 5,301,142 | * 4/1994 | Suzuki et al. | 365/51 |
| 5,757,701 | * 5/1998 | Kobayashi | 365/189.05 |
| 5,808,487 | 9/1998 | Roy | 327/55 |
| 6,154,064 | * 11/2000 | Proebsting | 327/55 |

FOREIGN PATENT DOCUMENTS

0852381-A2 * 7/1998 (EP).
404362592-A * 12/1992 (JP).

* cited by examiner

*Primary Examiner*—Son Mai
(74) *Attorney, Agent, or Firm*—Smith, Danamraj & Youst, P.C.

(57) ABSTRACT

A hierarchical sense amp and write driver (SA/WD) circuitry architecture for compilable high-density memory. A predetermined number of secondary, or regional, SA/WD blocks segment the main array associated with the memory instance in multiple banks. Each secondary SA/WD block is coupled to a tertiary, or global, SA/WD block via a global I/O line operating to effectuate data I/O on a per I/O basis with respect to the memory instance. A select number of primary SA/WD blocks per each secondary SA/WD block are specified, wherein the primary SA/WD blocks segment a memory bank associated with a particular secondary SA/WD block into a plurality of sub-banks. Each primary SA/WD block is coupled to a select secondary SA/WD block associated therewith via a common regional I/O line. A select number of memory cells per bitline segment for each of the memory sub-banks may be specified as part of compiling a memory instance for a particular application.

25 Claims, 9 Drawing Sheets

HIERARCHICAL SENSE AMP AND WRITE DRIVER CIRCUITRY FOR COMPILABLE MEMORY

CROSS-REFERENCE TO RELATED APPLICATION(S)

This application discloses subject matter related to the subject matter disclosed in the following commonly-assigned patent application(s): (1) "Centrally Decoded Divided Wordline (DWL) Memory Architecture," filed Apr. 3, 2000, Ser. No. 09/532,033, in the name(s) of: Richard S. Roy; (2) "Fast Full Signal Differential Output Path Circuit for High-Speed Memory," filed Jun. 28, 2000, Ser. No. 09/605,221, in the name(s) of: Richard S. Roy.

BACKGROUND OF THE INVENTION

1. Technical Field of the Invention

The present invention relates generally to semiconductor memories, and more particularly, to compilers for high-speed and high-density semiconductor memories having hierarchical sense amplifier (sense amp) and write driver circuitry.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—preimplemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that the existing memory compilers are adequate for designing low density memory arrays e.g., up to 4 Mbit memories. However, as arrays get larger for higher density by increasing in the X-direction (by adding additional columns or bitlines), Y-direction (by adding additional rows or wordlines), or both, parameters such as RC time delay, etc., which have a deleterious effect on the performance of a memory circuit, become significant in both directions of an array. Accordingly, it is common practice in the memory design art to segment the array in the Y-direction in order to provide additional sense amplifiers (SA) and associated write driver (WD) circuitry (referred to as primary SA/WD circuitry) at predetermined locations across the memory array. That is, for every predetermined number of wordlines, a horizontal band or strip of sense amplifier/write driver circuitry is provided in the Y-direction of the array. Consequently, the RC delay effects in the Y-direction are mitigated because the total length of bitline per primary sense amplifier (i.e., "bitline segment") is considerably reduced. This practice of segmenting the array vertically is sometimes referred to as "banking."

It is also known in the art to segment the wordlines in order to reduce the RC delay effects along the X-direction of the array. Typically, a local wordline decoder is provided at specific locations in the memory array along the X-direction which receives main wordline signals from a main row decoder. The main wordline signals are then decoded by the local wordline decoder in order to select a particular local row or wordline (or, sub-word line). This scheme is known in the industry as the "divided wordline" or DWL architecture.

Although advances such as those described above attempt to address the RC delay effects in large memory arrays, several deficiencies and shortcomings continue to exist. For example, where the sizes of the devices comprising the primary SA/WD circuitry are required to be absolute minimum, which is ideal for both highest density and highest speed memory, the number of cells per bitline segment that the sense amp circuitry can effectively drive needs to be significantly reduced (e.g., 32 cells per segment) without incurring a severe area penalty (which results from the larger size devices required to drive). That is because, as the device sizes get larger, parasitic diode capacitance effects become significant and negatively impact the performance. In other words, there exists a sense amp size versus speed versus parasitic diode effect trade-off in larger arrays which cannot be adequately addressed by the existing SA/WD architectures. Further, merely increasing the number of primary SA/WD bands having minimum geometry devices does not effectively solve the problem. For a high speed 16 Mbit compiler (with 4 K physical rows and 4 K physical columns, having 64 cells per bitline segment), for instance, the number of primary SA/WD circuits required to be disposed on global I/O lines increases to 64. Even this arrangement is not effective because of lack of drive as well as rapid buildup of diode capacitance on the global I/O lines due to frequent primary SA circuits.

Increasing the number of cells per bitline segment (which can increase the speed on the global path by reducing the number of sense amp stripes, reducing the amount of parasitic diode capacitance on the global path) also does not solve the problem because it creates a significant speed penalty for normal bitlines used in memories, particularly for dynamic random access memory (DRAM) structures. Static RAM (SRAM) structures are also negatively impacted by this drawback. In addition, this approach is beset with a significant write power penalty as well, due to full swing voltages on longer differential bitlines, as compared to differential or power-reduced single-ended swings on global I/O lines.

SUMMARY OF THE INVENTION

Accordingly, the present invention advantageously provides a hierarchical sense amp and write driver (SA/WD)

circuitry architecture for compilable high-density memory that optimizes speed, power, and area considerations. A predetermined number of secondary, or regional, SA/WD blocks segment the main array associated with the memory instance in multiple banks. Each secondary SA/WD block is coupled to a tertiary, or global, SA/WD block via a global I/O line operable to effectuate data I/O with respect to the memory instance. A select number of primary SA/WD blocks per each secondary SA/WD block are specified, wherein the primary SA/WD blocks segment a memory bank associated with the particular secondary SA/WD block into a plurality of sub-banks. Each primary SA/WD block is coupled to a select secondary SA/WD block associated therewith via a regional I/O line. A select number of memory cells per bitline segment driven by the primary SA/WD block (having absolute minimum geometry, e.g., cross-coupled latch used for reading and writing, with pass gates only) for each of the memory sub-banks may be specified as part of compiling a memory instance for a particular application.

In one exemplary embodiment, the memory instance comprises a multi-bank DRAM array wherein circuitry comprising the regional SA/WD block(s) may preferably be provided as a plurality of conventional single-ended buffer stages (typically comprised of standard CMOS inverters) applied in both directions (one for the Data In path and the other for the separate Data Out path). Also, the regional SA/WD circuitry may preferably be comprised of bi-directional small signal transceiver/repeater circuitry that allows differential read as well as write capability.

In another exemplary embodiment, the memory instance comprises a multi-bank SRAM array having one or more regional SA/WD blocks with circuitry such as described in the foregoing. In both DRAM and SRAM instances, several combinations of the global and regional I/O implementations (e.g., single-ended versus differential I/O) are possible. Where a DWL architecture is implemented, control circuitry responsible for the primary and regional SA structures is preferably placed in the control areas created at the intersection of local wordline decoders and primary and regional SA/WD bands, respectively. Accordingly, such localized (or distributed) SA control circuitry provides better controllability of signals on a per I/O basis for a memory compiler.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1A:
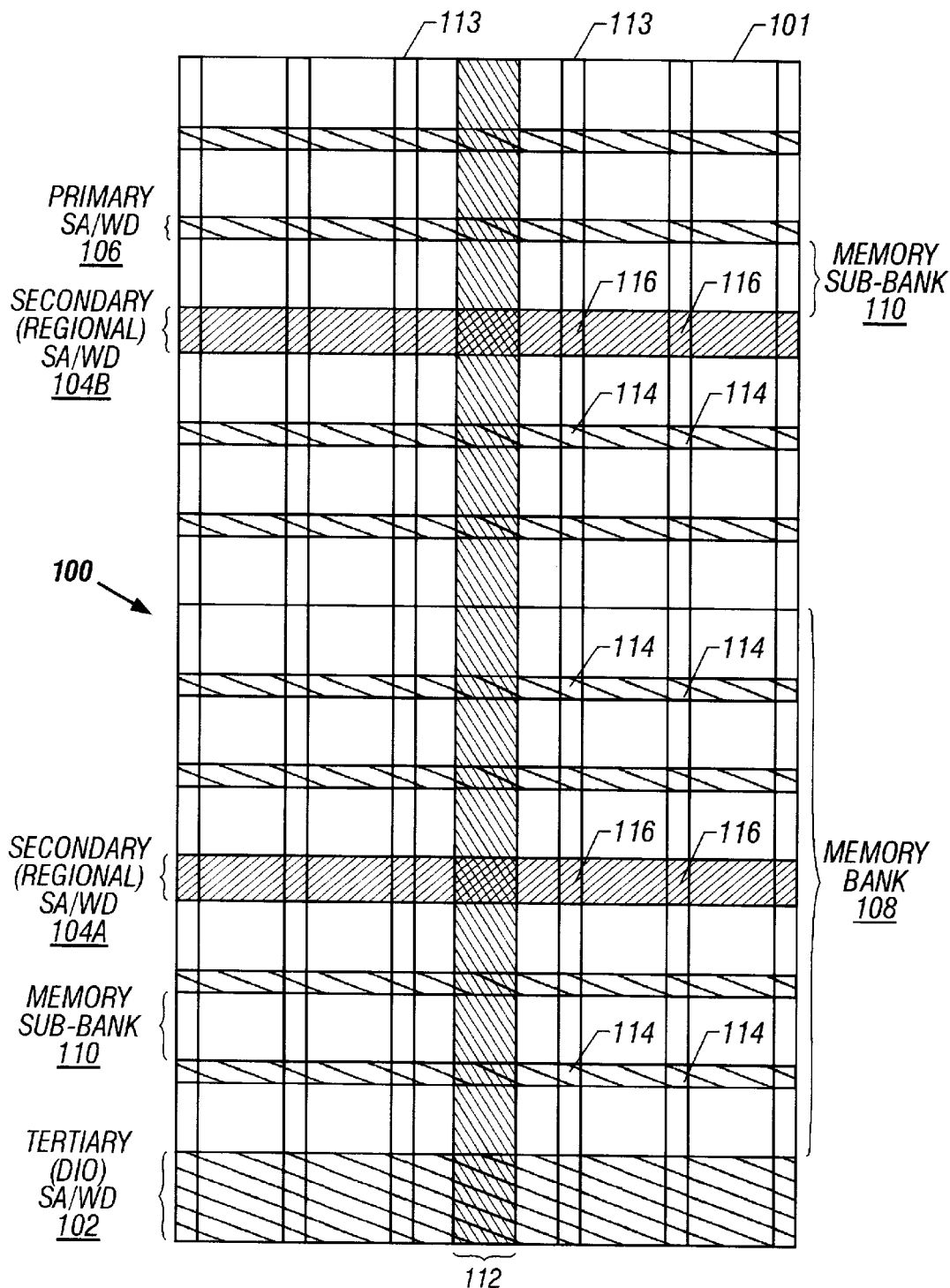
FIG. 1A is a physical architectural view of a presently preferred exemplary embodiment of a multi-bank memory instance having hierarchical sense amp/write driver circuitry in accordance with the teachings of the present invention.

In the drawings, like or similar elements are designated with identical reference numerals throughout the several views thereof, and the various elements depicted are not necessarily drawn to scale. Referring now to FIG. 1A, depicted therein is a physical architectural view of a presently preferred exemplary embodiment of a multi-bank memory instance 100 having a hierarchical sense amp/write driver circuit architecture in accordance with the teachings of the present invention. Preferably, the memory instance 100 may be comprised of DRAM or SRAM cells organized into a main array 101 having a predetermined number of I/Os. Reference numerals 104A and 104B exemplify a plurality of bands of secondary (or regional) sense amplifier/write drive circuitry (RSAWD circuitry) which segment the main array 101 of the memory circuit instance 100 in the Y-direction into a plurality of banks, e.g., Memory Bank 108. Each memory bank is sub-divided into a plurality of sub-banks, e.g., Memory Sub-Bank 110, by virtue of a plurality of primary SA/WD blocks (PSAWD), e.g., PSAWD 106, wherein each PSAWD block is conventionally operable with respect to the bitline segments (not explicitly shown) comprising the memory sub-bank associated therewith. A tertiary SA/WD block (TSAWD) 102 is operably associated with the memory instance 100 to effectuate data input/output (DIO) operations with respect to the main memory array 101 in conjunction with the PSAWD and RSAWD blocks, as will be described in detail hereinbelow.

A main wordline (WL) decoder (XDEC) 112 is preferably included in the memory circuit 100 as an integrated centrally located decoder structure for decoding at least a portion of row address signals in order to generate main wordline signals which are provided to a plurality of local wordline decoders, e.g., local WL decoder 113, disposed in the array 101 that is segmented thereby in the X-direction also. Thus, the main array 101 may be visualized as an orderly composition of a plurality of local arrays (or sub-arrays) arranged in both X- and Y-directions.

Those skilled in the art should appreciate that by providing sense amplifier and column circuitry bands horizontally, and by means of vertically-placed local wordline decoders, areas in the bands are created such that control logic circuitry associated with a select SA/WD band may be placed therein. Accordingly, such localized control circuitry provides better controllability of signals on a per I/O basis for a memory compiler. For example, control areas 114 created at the intersection of the local WL decoders and PSAWD blocks comprise circuitry for controlling the PSAWD circuitry. Similarly, a plurality of control areas 116 at the intersection of the local WL decoders and RSAWD blocks comprise circuitry for controlling the RSAWD circuitry.

Additional details regarding the divided WL architecture of the memory instance 100 may be found in the following co-pending, commonly-assigned patent application: "Centrally Decoded Divided Wordline (DWL) Memory Architecture," filed Apr. 3, 2000, Ser. No. 09/532,033, in the name(s) of: Richard S. Roy, cross-referenced hereinabove and incorporated by reference herein.

Continuing to refer to FIG. 1A, it should be appreciated that known and heretofore unknown sense amp circuitry may be provided for sensing data on the bitline segments by the PSAWD block circuitry. For example DC op-amps, clocked op-amps, clocked cross-coupled CMOS inverter latches, etc. are operable within the scope the of the present invention. Further, in an exemplary embodiment, an individual data signal representing a single unit of information, or data bit, may be transmitted along a single data line (i.e., single-ended I/O), wherein the voltage of the signal on the data line ranges between $V_{DD}$ and $V_{SS}$, where $V_{DD}$ represents the positive power supply voltage level and $V_{SS}$ represents the ground voltage level. These boundary voltage levels $V_{DD}$ and $V_{SS}$, known as the rail voltages, determine the state of the data bit being transmitted. Alternatively, the data signal can be transmitted along a pair of lines (e.g., bitlines, BIT and BITB) with the data state represented by a differential voltage between the line pair. Preferably, the differential voltage is a fraction of the full rail voltage, e.g., 300 millivolts with respect to a typical CMOS 3.3 volt $V_{DD}$ full rail voltage level. The DC bias voltage of the line pair could range between $V_{DD}$ and $V_{SS}$, and it is well known in the memory design art to use many different bias voltage levels depending on the particular requirements of a specific application. In this scenario, a first data state (such as a data "0") may be represented by a first polarity differential, and a second data state (such as a data "1") may be represented by an opposite polarity differential. Additional details regarding the sense amp circuitry that is operable with respect to the local memory arrays disposed in an instance such as the multi-bank memory instance 100 may be found in the following co-pending, commonly-assigned patent application: "Fast Full Signal Differential Output Path Circuit for High-Speed Memory," filed Jun. 28, 2000, Ser. No. 09/605,221, in the name(s) of: Richard S. Roy, cross-referenced hereinabove and incorporated by reference herein.

In addition, the RSAWD block circuitry of the multi-bank memory instance 100 is preferably provided as a signal transfer circuit block that enables rapid transfer of differential electrical signals for both read and write operations with respect to the memory array. Thus, the RSAWD blocks 104A and 104B are preferably comprised of bidirectional signal transceiver/repeater circuits. For example, a small signal transceiver/repeater disclosed in U.S. Pat. No. 5,808,487 to Richard S. Roy may be employed in the RSAWD block circuitry of the multi-bank memory instance 100 in a presently preferred exemplary embodiment of the present invention. This reference, U.S. Pat. No. 5,808,487 to Richard S. Roy, is incorporated by reference herein.

Figure 1B:
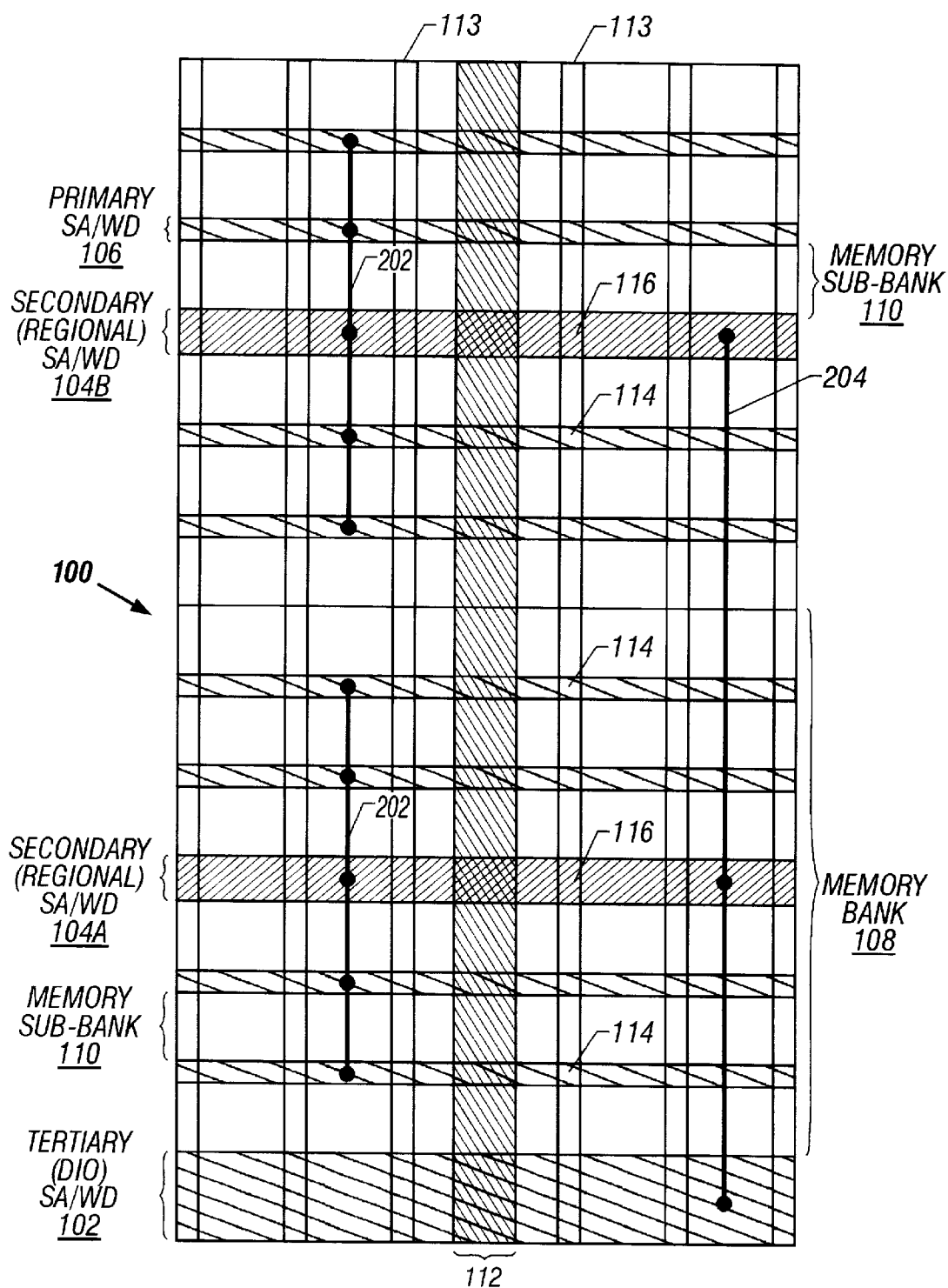
FIG. 1B depicts the multi-bank memory instance of FIG. 1A wherein regional I/O lines couple primary SA/WD blocks with secondary, or regional, SA/WD blocks and global I/O lines couple the secondary SA/WD blocks with a tertiary SA/WD block for effectuating data I/O in accordance with the teachings of the present invention.

FIG. 1B depicts the memory instance 100 shown in FIG. 1A, wherein I/O line inter-connectivity between the memory banks and sub-banks is particularly exemplified for effectuating I/O operations in accordance with the teachings of the present invention. As illustrated in this FIG., each PSAWD block operable with respect to a particular local memory sub-bank is commonly coupled to the RSAWD block associated therewith. Accordingly, four PSAWD blocks provided in Memory Bank 108 are coupled to the RSAWD block 104A via a regional I/O line 202. The RSAWD blocks, in turn, are commonly coupled via global I/O lines, e.g., global I/O line 204, on a per I/O basis.

In general operation, a selected memory cell transfers a small differential voltage signal onto a pair of complementary bitline segments of a sub-bank, which is sensed by the PSAWD block associated therewith. In one exemplary embodiment, the PSAWD block circuitry may detect the small differential voltage and produce a full rail voltage level representative of the data state of the memory cell on the corresponding regional I/O line. The RSAWD circuitry, operating as a transceiver/repeater block, outputs the full rail voltage onto the corresponding global I/O line, which is then provided to the output (DOUT) of the memory instance. The same sequence of the steps may be effectuated in the opposite direction with respect to a write operation whereby a data bit is written into a selected memory cell. In the full rail case, it is generally preferable to separate the Data In path from the Data Out path for ease of control and speed.

In another exemplary embodiment, the PSAWD block circuitry may detect the small differential voltage on the bitline segments and amplify internally and drive a similar small voltage differential to the corresponding regional I/O lines (as in U.S. Pat. No. 5,808,487 to Richard S. Roy, referred to hereinabove). The RSAWD circuitry associated with the selected memory bank may generate a full rail voltage and output it onto the corresponding global I/O line. Or, the RSAWD circuitry may amplify and output a small differential level to the TSAWD amplifier block via the global I/O lines, which then produces a full rail voltage indicative of the sensed data on the differential global output lines.

It should therefore be readily appreciated by those skilled in the art that numerous combinations may be had in the implementation of the hierarchical SA/WD architecture of the present invention. As alluded to above, differential signal transmission may be used in both read and write directions, which optimizes speed and power at the expense of control complexity. Further, the implementation is not required to be symmetric with respect to the read and write directions. For small signal differential write operations on the regional I/O, the primary SA may be used as write driver on the bitline segments, which may increase the complexity of control for the PSAWD circuitry to accurately sense the differential signal level on the regional I/O line(s) and resolve it into full rail voltage levels on the bitline segments. Also, the PSAWD circuitry may be bypassed in the write direction, provided a full swing write differential signal is available on the appropriate regional I/O line. In addition, a combination of single-ended global I/O with differential regional I/O transmission may also be implemented in certain embodiments. Conversely, single-ended regional I/O and differential global I/O may provide the best speed/power combination. As alluded to hereinabove, control circuitry responsible for controlling the PSAWD and RSAWD circuitry may preferably be provided in the control areas 114 and 116, respectively.

Figure 2:
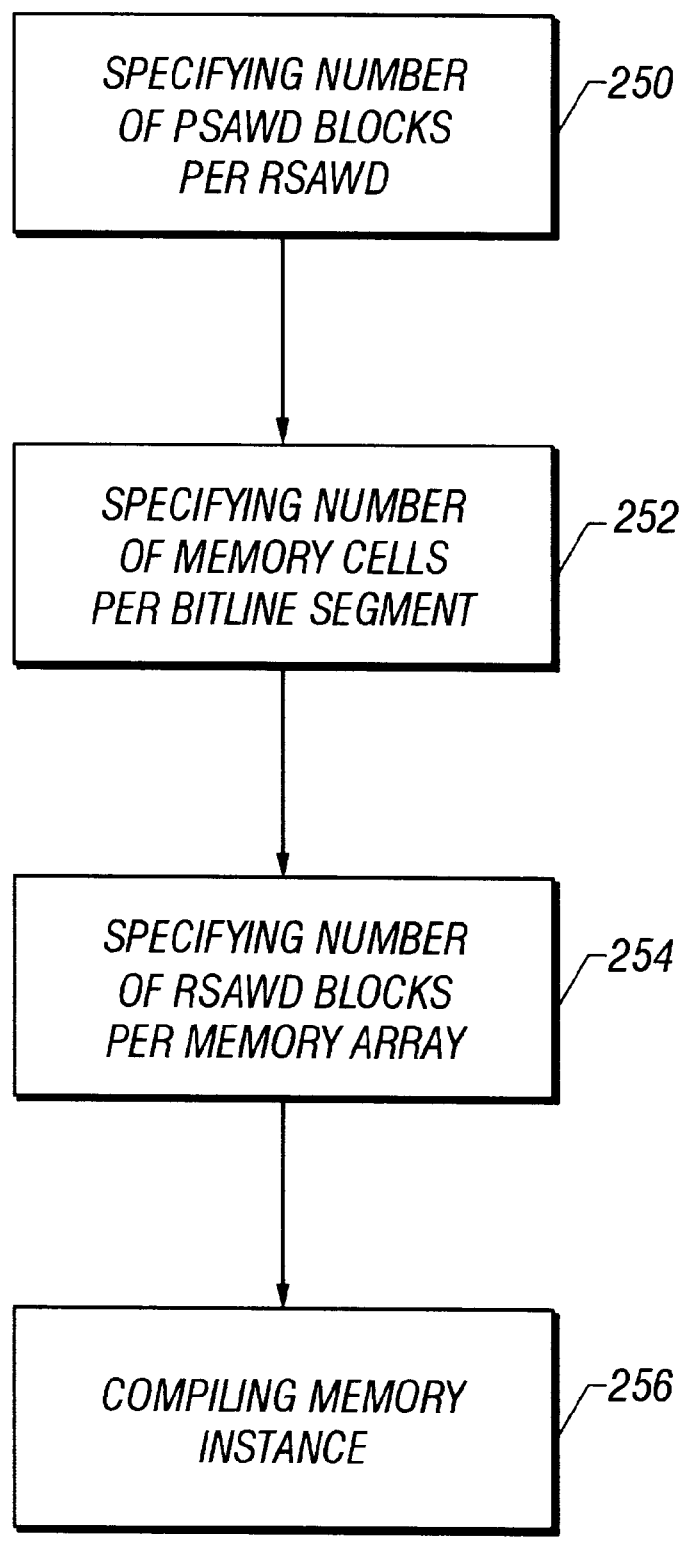
FIG. 2 is a flow chart describing a methodology of compiling memory instances having a hierarchical SA/WD architecture in accordance with the teachings of the present invention.

Referring now to FIG. 2, depicted therein is a flow chart which describes an exemplary methodology of compiling memory instances having a hierarchical SA/WD architecture in accordance with the teachings of the present invention. A suitable user interface (not shown) may be provided wherein a designer is prompted for inputting certain key design criteria, not necessarily in any particular order. Such criteria comprise the number of RSAWD blocks (which determines the number of banks in the memory instance), number of PSAWD blocks per RSAWD, and the number of memory cells per bitline segment, which is determined by the trade-off between the sizes of the devices used in the PSAWD circuitry (for drive/speed considerations) and the parasitic diode capacitance effects. Upon specifying the number of PSAWD blocks per each RSAWD block (step 250), thereby specifying the number of sub-banks per memory bank, the number of memory cells per bitline segment is specified (step 252) by taking into account speed, power, and area considerations. The number of RSAWD blocks in the array is specified by determining the number of memory banks needed for a particular application (step 254). Memory compilation methodology proceeds with appropriate steps subsequently for completing the process (step 256).

Figure 3:
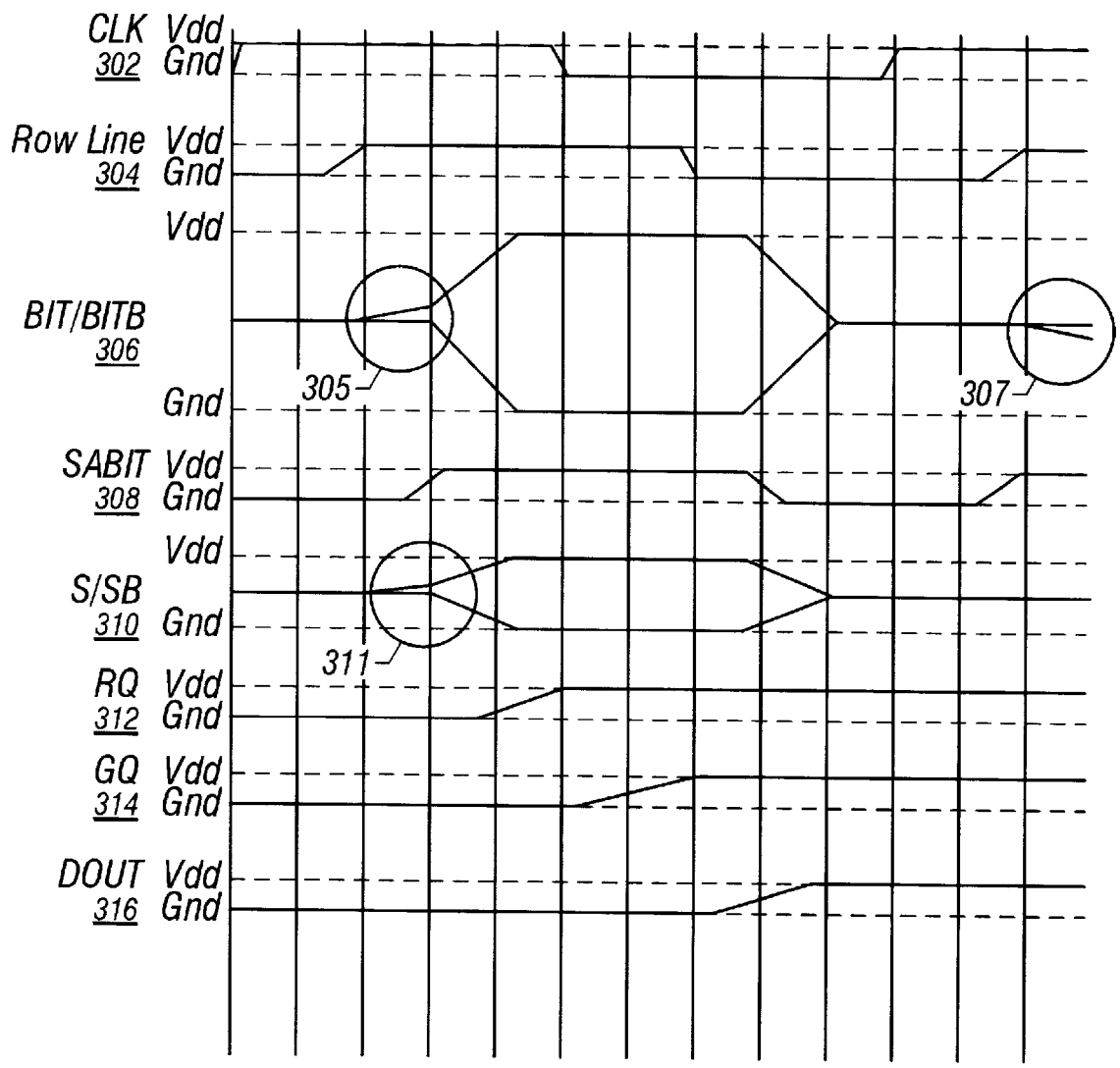
FIG. 3 depicts a timing diagram for an exemplary read operation with full rail read signals on the regional and global I/O lines.

FIG. 3 depicts a timing diagram for an exemplary DRAM read operation with a full read signal developed by the regional SA/WD block of the memory instance, wherein both the regional and global I/O lines are provided as single-ended I/O lines with data transitions being signified by full-swing rail voltage levels. Upon asserting a CLK 302 for initiation of the memory access cycle, a selected row line 304 goes high. Thereafter, a small signal differential is developed on the BIT/BITB pair 306, as indicated by reference numeral 305 which exemplifies a "read 1" operation. If a differential signal with a reverse polarity is developed, a "read 0" operation (reference numeral 307) is exemplified.

A Bitline Sense Amp Enable (SABIT) signal 308 is utilized to enable the bitline sense amp (i.e., PSAWD circuitry) which drives the voltage differential to full rail voltage levels. As alluded to before, in one exemplary embodiment the operation of the bitline sense amp is similar to the operation of the clocked cross-coupled latch sense amp circuitry commonly used in the DRAM prior art.

Once the bitline sense amp is enabled, the levels on the internal nodes S and SB (reference numeral 310) of the sense amp are pulled apart (as indicated by reference numeral 311), essentially tracking the voltage separation on the BIT/BITB lines. As is well known in the art, the S/SB nodes are operable to refresh the BIT/BITB lines (because DRAM is exemplified). However, the S/SB nodes do not provide such refresh voltage to the BIT/BITB lines in the SRAM implementations in order to save power, improve bitline precharge condition for the next cycle, etc. In these implementations, the sense amp nodes S/SB are isolated from the bitline nodes BIT/BITB simultaneous with enabling the sense amp as described in the co-pending, commonly-assigned patent application entitled "Fast Full Signal Differential Output Path Circuit for High-Speed Memory" (Ser. No. 09/605,221), which was cross-referenced and incorporated hereinabove.

The full rail voltage on S/SB 310 drives a buffer inverter or series-connected pair of inverters to drive the single-ended regional I/O line (the signal being indicated herein as RQ 312) to an appropriate state depending on the data bit being read. In the example shown, since a "read 1" is being effectuated, the single-ended RQ 312 goes from low to high. The RSAWD circuitry associated with the regional I/O line is operable as a bi-directional transceiver/repeater circuit to transfer the full rail voltage and, accordingly, a few stages later, the corresponding single-ended global I/O line (being indicated herein as GQ 314) also undergoes the same transition signifying a "read 1" operation. Thereafter, a full rail $V_{DD}$ level is generated as a data out signal (DOUT 316) on an appropriate I/O of the memory instance.

Figure 4:
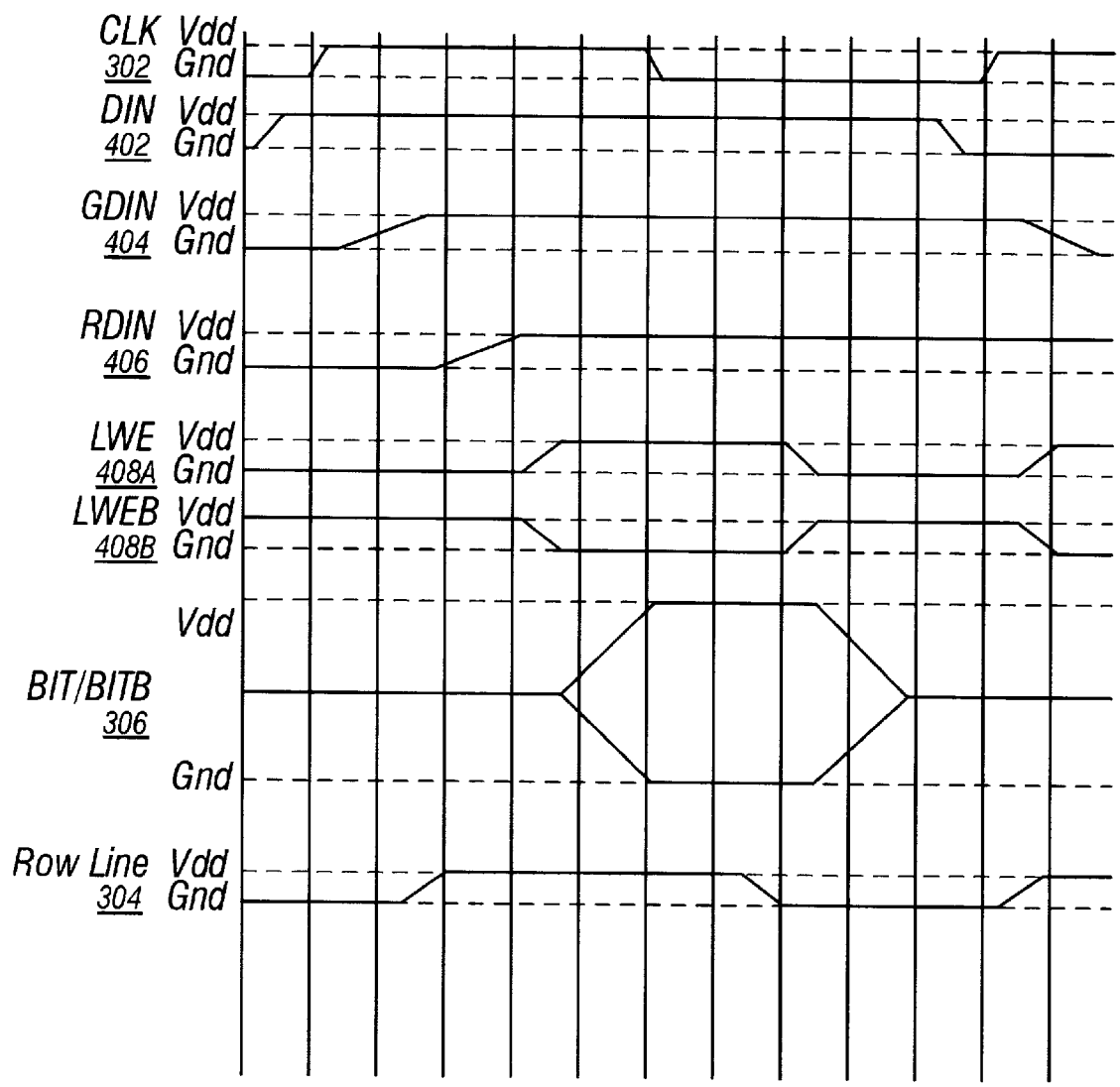
FIG. 4 depicts a timing diagram for an exemplary write operation with full rail write signals on the regional and global I/O lines.

FIG. 4 depicts a timing diagram for an exemplary DRAM write operation with a full write signal developed by the regional SA/WD block. Once again, both the regional and global I/O lines are exemplified as single-ended I/O lines, and it should be apparent to those skilled in the art that the write operation is essentially similar to the read operation set forth above, albeit in the reverse direction.

Prior to asserting CLK 302, a Data In (DIN) signal 402 goes high, signifying a "write 1" operation. Single-ended global and regional I/O lines (indicated herein as GDIN 404 and RDIN 406, respectively) are driven high as the full rail data signal is propagated to the local memory sub-bank via the TSAWD and RSAWD blocks. Separate local write drivers may be provided in the PSAWD circuitry (which may be tri-stated during read operations) for the N-channel and P-channel drivers of the bitline write path to the local memory sub-bank. These local write drivers are enabled by Local Write Enable (LWE) and Local Write Enable Bar (LWEB) signals (reference numerals 408A and 408B, for N-channel and P-channel drivers, respectively), which pull the voltage levels on BIT/BITB 306 to full rail levels to effectuate writing of the data bit (BIT is driven high and BITB is driven low, signifying the "write 1" operation) when the selected row line 304 is driven high. As is well known, a shutdown sequence takes place after the write operation, wherein BIT/BITB lines are equalized (e.g., $V_{DD}/2$) for the next access cycle.

Figure 5:
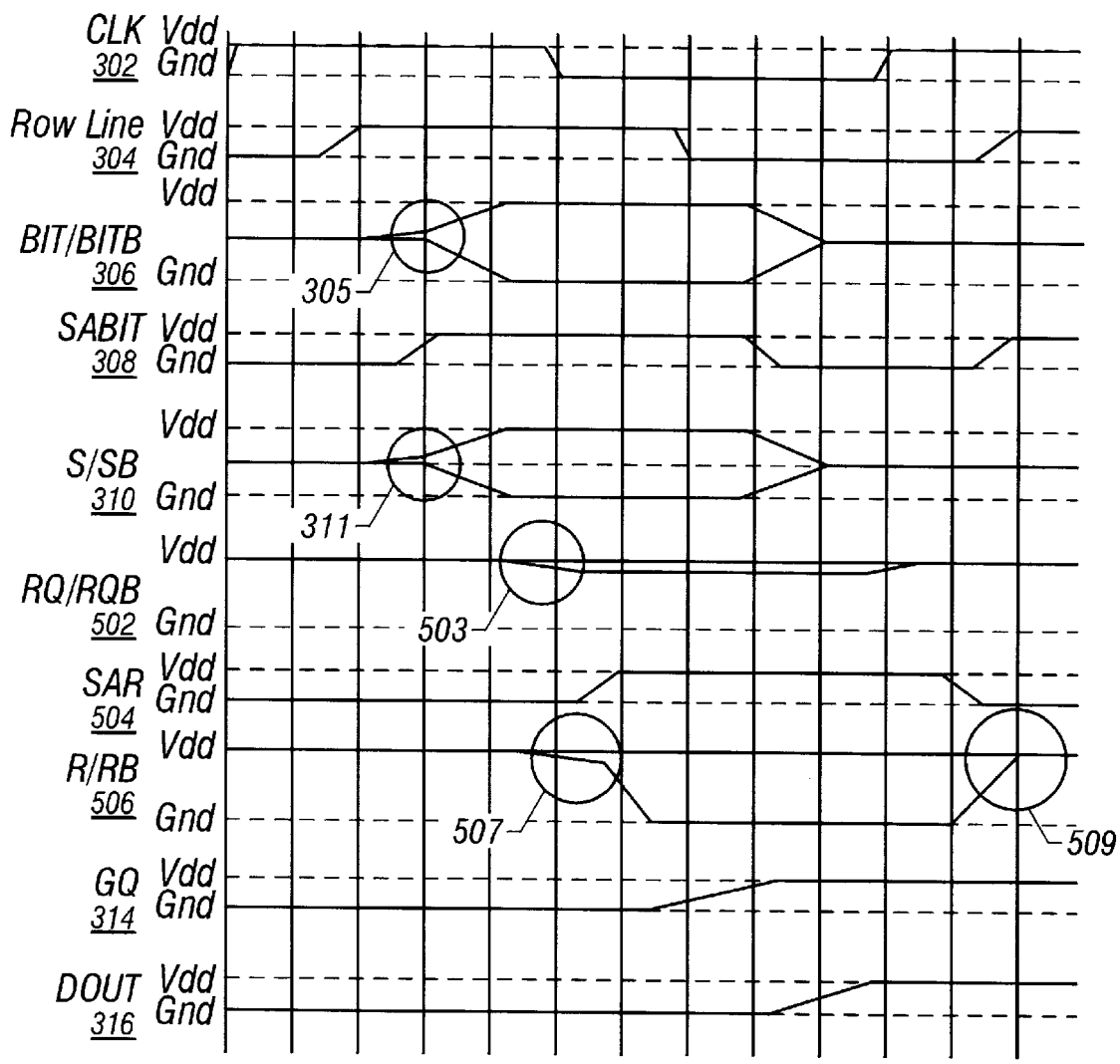
FIG. 5 depicts a timing diagram for an exemplary read operation with a small differential read signal on the regional I/O line and full read signal on the global I/O line.
Figure 6:
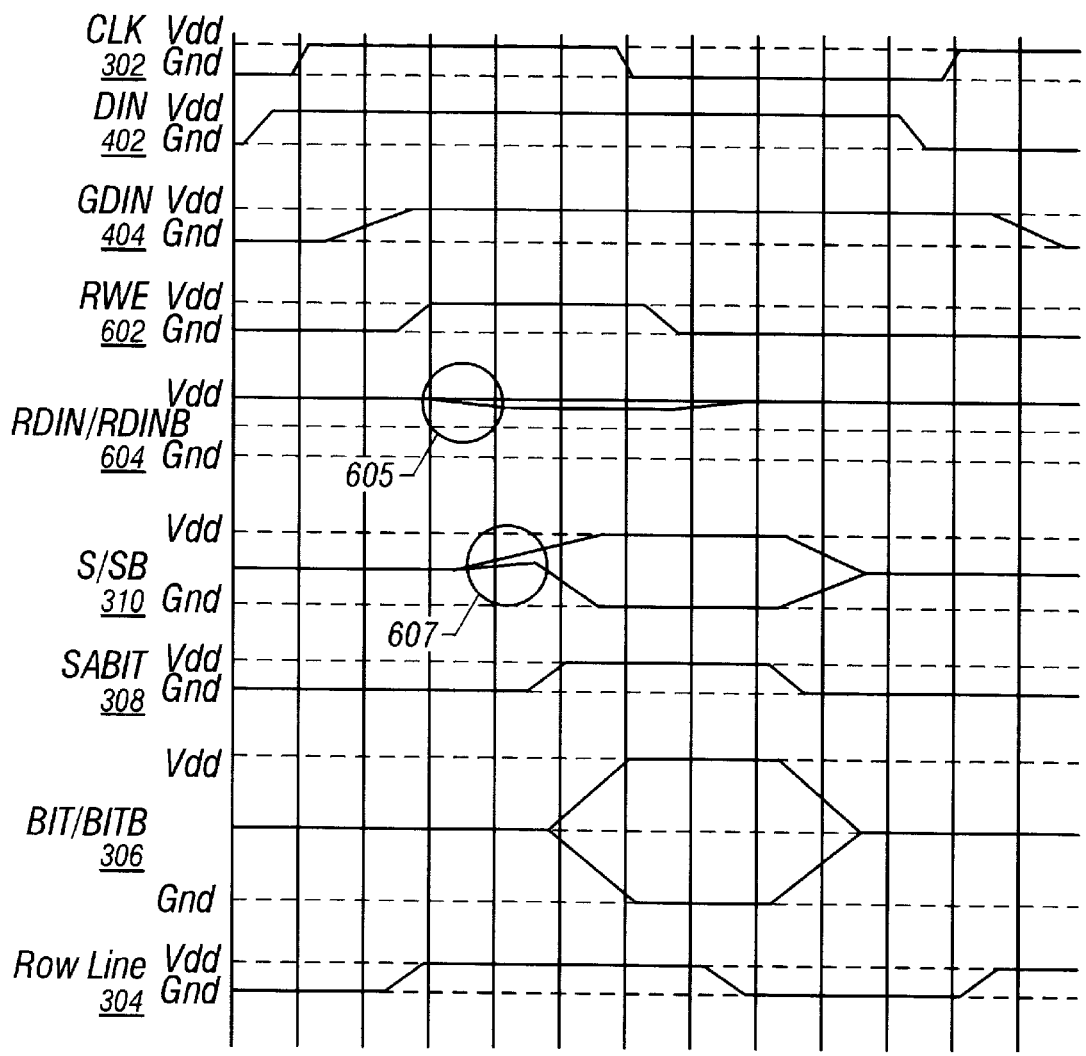
FIG. 6 depicts a timing diagram for an exemplary write operation with a small differential write signal on the regional I/O line and full write signal on the global I/O line.
Figure 7:
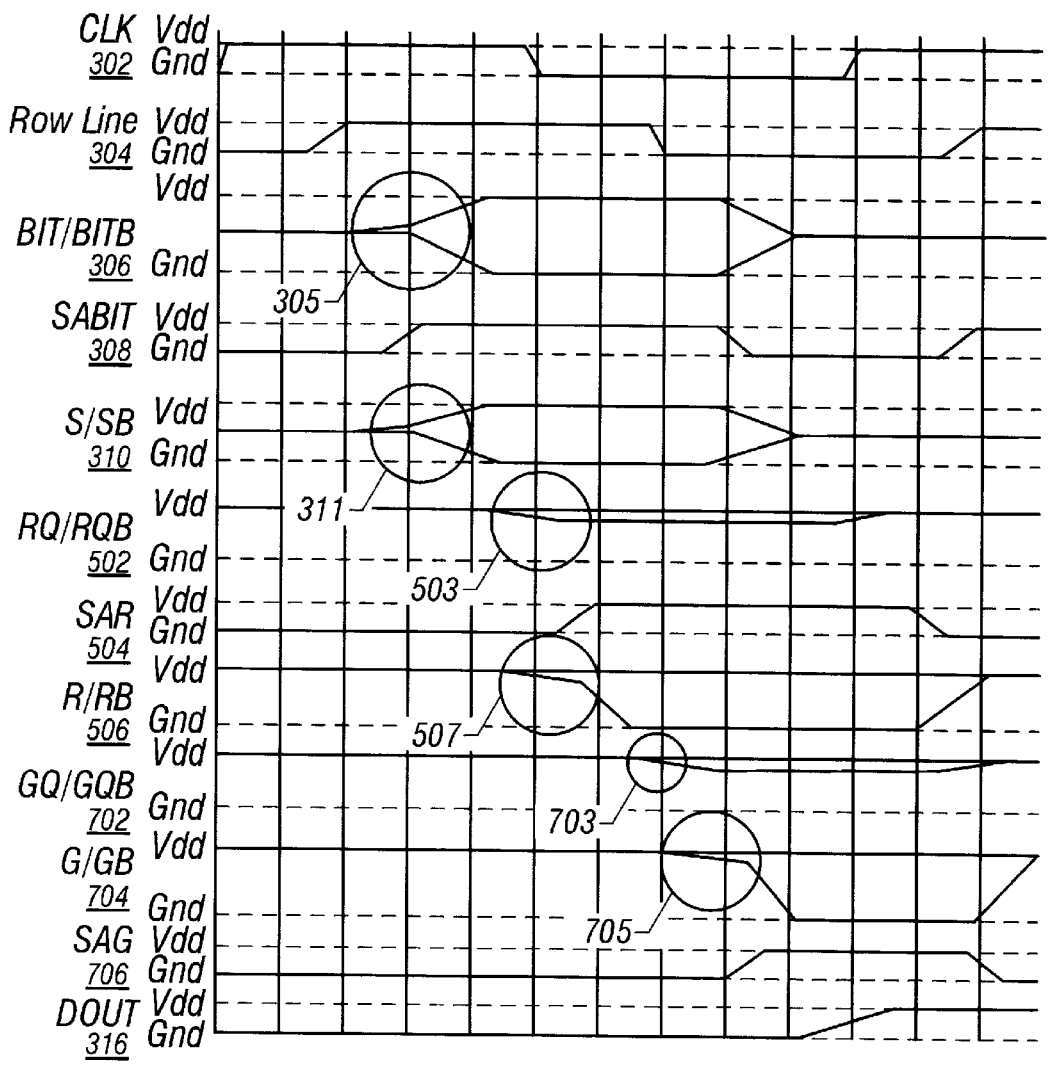
FIG. 7 depicts a timing diagram for an exemplary read operation with small differential read signals on both regional and global I/O lines.
Figure 8:
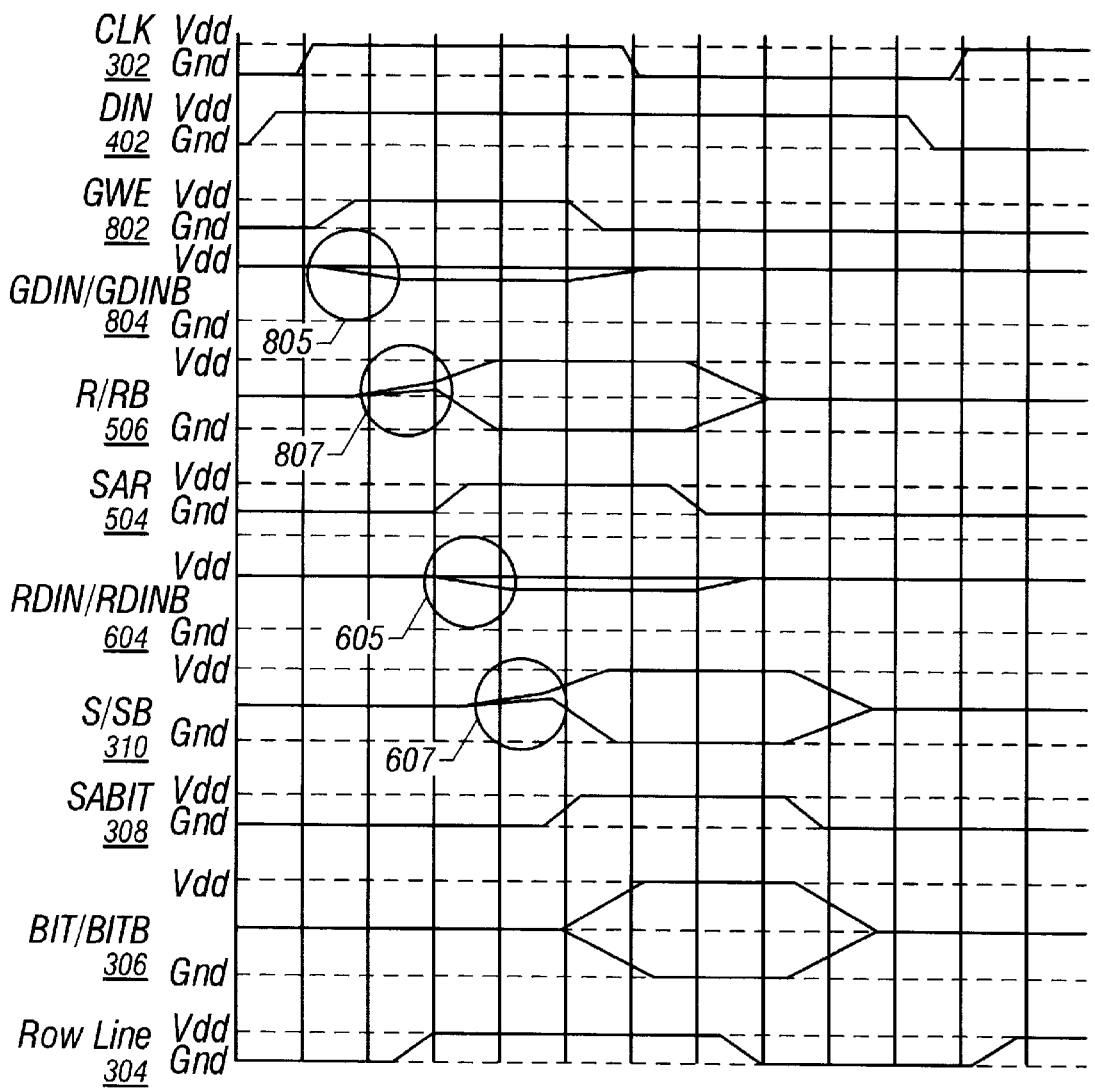
FIG. 8 depicts a timing diagram for an exemplary write operation with small differential write signals on both regional and global I/O lines.

FIGS. 5 through 8 depict timing diagrams for various other exemplary read and write operations involving different signal combinations of the regional and global I/O lines. In particular, FIGS. 5 and 6 refer to the read/write operations in a circuit with small signal differential regional I/O lines and full signal, single-ended global I/O lines. FIGS. 7 and 8 refer to the read/write operations in a circuit where both regional I/O and global I/O lines are provided to be operable with small signal differential voltages. Essentially, when the regional I/O lines are operable with small signal differential voltages, the RSAWD circuitry operates as bi-directional transceiver/repeater circuitry and senses data states in a fashion similar to the operation of the bitline SA and write driver circuitry (i.e., PSAWD). Where both regional I/O and global I/O lines are provided to be operable with small signal differential voltages, both RSAWD and TSAWD blocks are also operable in similar fashion.

Continuing to refer to FIG. 5 for the read operation, upon asserting the CLK signal 302, the row line 304, BIT/BITB 306, SABIT 308 and S/SB 310 undergo transitions similar to the transitions described hereinabove with reference to the full signal, single-ended read operation depicted in FIG. 3. Thereafter, voltage levels on the differential regional I/O lines RQ/RQB 502 separate slightly (reference numeral 503), whose polarity is dependent on the data bit being read. In this implementation, the Primary Sense Amp only drives the regional differential lines with a low current output, thereby minimizing the signal swing (and therefore the power consumption of the regional differential lines). A Regional Sense Amp Enable (SAR) signal 504 is asserted to enable the RSAWD circuitry for sensing the voltage differential on RQ/RQB 502. The internal nodes of the Regional SA, R/RB 506, are then driven to full rail voltage levels (reference numeral 507). The tri-statable driver output is turned off thereafter (reference numeral 509). Responsive to the full rail voltage levels on the internal R/RB nodes, the single-ended global I/O line, GQ 314, is driven high, signifying the "read 1" operation. Thereafter, DOUT 316 is pulled high for outputting data as described hereinabove.

FIG. 6 depicts the write operation, which is similar to the write operation shown in FIG. 4. However, because of the small signal differential write levels on the regional I/O, the Regional Data In is provided as RDIN and RDINB 604.

Once the incoming data signal is propagated to the single-ended GDIN 404, a Regional Write Enable (RWE) signal 602 is asserted for effectuating the small write signal separation (reference numeral 605) on RDIN/RDINB 604. The Primary Sense Amp 106 must now be operable to sense the differential voltage on RDIN/RDINB. One example of a bi-directional structure capable of sensing small signal information coming from both directions is disclosed in the previously referenced U.S. Pat. No. 5,808,487. Thereafter, S/SB 310 of the bitline SA/WD circuitry separate (reference numeral 607) to full rail levels. BIT/BITB 306 are then separated also upon application of SABIT 308. Writing of the data bit (BIT is driven high and BITB is driven low, signifying the "write 1" operation) is effectuated when the selected row line 304 is driven high in conventional manner. As alluded to before, a shutdown sequence takes place thereafter, wherein BIT/BITB lines are equalized (e.g., $V_{DD}/2$) for the next access cycle.

As pointed out earlier, the timing diagrams depicted in FIG. 7 and FIG. 8 refer to read and write operations, respectively, where differential signal transmission is used on both regional and global I/O lines. Because of similarity to the description set forth hereinabove, only some of the salient features regarding these timing diagrams will be provided in greater detail.

During the "read 1" cycle, the internal nodes of the regional SA (R/RB 506) separate as described in the foregoing with respect to FIG. 5. Thereafter, the differential global I/O lines (referred to as GQ/GQB 702 herein) are driven to separate slightly (reference numeral 703). Subsequently, the internal nodes (G/GB 704) of the tertiary SA circuitry are driven to full rail voltages (reference numeral 705) upon application of a Global Sense Amp Enable (SAG) signal 706 to enable the TSAWD circuitry for sensing the voltage differential on GQ/GQB 704. The data outputting then follows conventionally.

During the "write 1" cycle, a Global Write Enable (GWE) signal 802 is asserted to effectuate a write small signal separation on the differential GDIN/GDINB lines 804. The internal nodes, R/RB 506, are driven to full rail (reference numeral 807), and upon application of SAR 504, the differential RDIN/RDINB 605 are driven to separate slightly (reference numeral 605). Thereafter, the process is similar to the write operation depicted in FIG. 6, as set forth above in greater detail.

Based on the foregoing, it should be appreciated that the present invention provides a hierarchical SA/WD architecture for use with memory compilers that advantageously overcomes the deficiencies and shortcomings of the prior art for large memory instance sizes. In addition to reducing power and RC time delays in large memory arrays, the teachings of the present invention are particularly advantageous for memory compilers, wherein certain key design criteria may be pre-specified for a desirable memory instance that optimizes area, speed, and density parameters. Furthermore, localization of control circuitry (for controlling the PSAWD and RSAWD blocks) allows better tracking of control signals (i.e., signal skews, etc.), whereby the electrical characteristics of dummy rows and dummy columns, if provided, are better matched with the active memory cells in the array for robust operation.

Additionally, it is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although the presently preferred exemplary embodiments of the present invention have been described in conjunction with a DWL architecture, it should be realized that the hierarchical SA/WD scheme of the present invention may be practiced without such divided wordlines. Further, as alluded to hereinbefore, numerous combinations are available by specifying the type of signal transmission on regional and global I/O lines and by implementing such combinations for read and write cycles selectively. Accordingly, it should be clearly understood that these and other numerous variations, substitutions, additions, re-arrangements, extensions, and modifications are contemplated to be within the ambit of the present invention whose scope is solely limited by the claims set forth below.

What is claimed is:

1. A compilable semiconductor memory circuit, comprising:
   a main array of memory cells organized into a plurality of memory banks and sub-banks;
   a tertiary sense amp/write driver (SA/WD) block associated with said main array of memory cells, said tertiary SA/WD being operable to effectuate data input and output (I/O) with respect to said compilable semiconductor memory circuit;
   at least one secondary SA/WD block coupled to said tertiary SA/WD block by a plurality of global I/O lines, said at least one secondary SA/WD block dividing said main array into said plurality of memory banks;
   a plurality of primary SA/WD blocks associated with said at least one secondary SA/WD block wherein said primary SA/WD blocks are coupled to said at least one secondary SA/WD by a plurality of regional I/O lines, said plurality of primary SA/WD blocks dividing a memory bank associated with said secondary SA/WD into said plurality of memory sub-banks, each of said primary SA/WD blocks being operable to drive bitline segments of a particular memory sub-bank associated therewith; and
   a plurality of local wordline (WL) decoders disposed in said main array of memory cells whereby said at least one secondary SA/WD block intersects said local WL decoders so as to create an area in said at least one secondary SA/WD block, wherein a regional control circuitry portion is capable of being placed within said area, said regional control circuitry portion being operable to control circuitry comprising said at least one secondary SA/WD block.

2. The compilable semiconductor memory circuit as set forth in claim 1, wherein said at least one secondary SA/WD block comprises bi-directional small signal transceiver/repeater circuitry for transmitting and receiving signals between said tertiary SA/WD block and primary SA/WD blocks.

3. The compilable semiconductor memory circuit as set forth in claim 1, wherein said memory cells comprise static random access memory (SRAM) cells.

4. The compilable semiconductor memory circuit as set forth in claim 1, wherein said memory cells comprise dynamic random access memory (DRAM) cells.

5. The compilable semiconductor memory circuit as set forth in claim 1, wherein said primary SA/WD blocks operate to drive said bitline segments for a read operation with respect to said particular memory sub-bank associated therewith.

6. The compilable semiconductor memory circuit as set forth in claim 1, wherein said primary SA/WD blocks operate to drive said bitline segments for a write operation with respect to said particular memory sub-bank associated therewith.

7. The compilable semiconductor memory circuit as set forth in claim 1, wherein said at least one secondary SA/WD block is operable to drive said regional I/O lines for a write operation with respect to a particular memory bank associated therewith, said write operation being effectuated by a full swing write differential signal generated on said regional I/O lines.

8. The compilable semiconductor memory circuit as set forth in claim 1, wherein said regional I/O lines are operable as differential I/O lines.

9. The compilable semiconductor memory circuit as set forth in claim 8, wherein said global I/O lines are operable as single-ended I/O lines.

10. The compilable semiconductor memory circuit as set forth in claim 1, wherein said regional I/O lines and global I/O lines are operable to carry small signal levels for effectuating data I/O operations.

11. The compilable semiconductor memory circuit as set forth in claim 1, wherein said regional I/O lines are operable to carry small signal levels and said global I/O lines are operable to carry full signal levels for effectuating data I/O operations.

12. The compilable semiconductor memory circuit as set forth in claim 1, wherein said regional I/O lines and global I/O lines are operable to carry full signal levels for effectuating data I/O operations.

13. The compilable semiconductor memory circuit as set forth in claim 1, wherein said regional I/O lines are operable to carry full signal levels and said global I/O lines are operable to carry small signal levels for effectuating data I/O.

14. A method of compiling a memory instance having a hierarchical sense amp architecture, comprising the steps of:
specifying a select number of secondary sense amp/write driver (SA/WD) blocks which segment a main array associated with said memory instance into a plurality of memory banks, wherein each of said secondary SA/WD blocks is coupled to a tertiary SA/WD block via a global input/output (I/O) line operating to effectuate data input and output (DIO) with respect to said memory instance;
specifying a select number of primary SA/WD blocks per each of said secondary SA/WD blocks, said primary SA/WD blocks segmenting a memory bank associated with said secondary SA/WD into a plurality of memory sub-banks, wherein each of said primary SA/WD blocks is coupled to said secondary SA/WD block associated therewith by a regional I/O line; and
specifying a select number of memory cells per bitline for each of said plurality of memory sub-banks.

15. The method of compiling a memory instance as set forth in claim 14, wherein said main array comprises a static random access memory (SRAM) array.

16. The method of compiling a memory instance as set forth in claim 14, wherein said main array comprises a dynamic random access memory (DRAM) array.

17. The method of compiling a memory instance as set forth in claim 14, wherein said global I/O lines are operable as single-ended I/O lines.

18. The method of compiling a memory instance as set forth in claim 14, wherein said regional I/O lines are operable as differential I/O lines.

19. The method of compiling a memory instance as set forth in claim 14, wherein said regional I/O lines and global I/O lines are operable to carry small signal levels for effectuating data I/O operations.

20. The method of compiling a memory instance as set forth in claim 14, wherein said regional I/O lines are operable to carry small signal levels and said global I/O lines are operable to carry full signal levels for effectuating data I/O operations.

21. The method of compiling a memory instance as set forth in claim 14, wherein said regional I/O lines are operable to carry full signal levels and said global I/O lines are operable to carry small signal levels for effectuating data I/O operations.

22. The method of compiling a memory instance as set forth in claim 14, wherein said regional I/O lines and said global I/O lines are operable to carry full signal levels for effectuating data I/O operations.

23. The method of compiling a memory instance as set forth in claim 14, wherein said secondary SA/WD block comprise bi-directional signal transceiver/repeater circuitry for transmitting and receiving signals between said tertiary SA/WD block and said primary SA/WD blocks.

24. A compilable semiconductor memory circuit, comprising:
a main array of memory cells organized into a plurality of memory banks and sub-banks;
a tertiary sense amp/write driver (SA/WD) block associated with said main array of memory cells, said tertiary SA/WD being operable to effectuate data input and output (I/O) with respect to said compilable semiconductor memory circuit;
at least one secondary SA/WD block coupled to said tertiary SA/WD block by a plurality of global I/O lines, said at least one secondary SA/WD block dividing said main array into said plurality of memory banks;
a plurality of primary SA/WD blocks associated with said at least one secondary SA/WD block wherein said primary SA/WD blocks are coupled to said at least one secondary SA/WD by a plurality of regional I/O lines, said plurality of primary SA/WD blocks dividing a memory bank associated with said secondary SA/WD into said plurality of memory sub-banks, each of said primary SA/WD blocks being operable to drive bitline segments of a particular memory sub-bank associated therewith; and
a plurality of local wordline (WL) decoders disposed in said main array of memory cells whereby each of said primary SA/WD blocks intersects said local WL decoders so as to create an area in said each primary SA/WD block, wherein a local control circuitry portion is capable of being placed within said area, said local control circuitry portion being operable to control circuitry comprising said each primary SA/WD block.

25. The compilable semiconductor memory circuit as set forth in claim 24, wherein said main array of memory cells is comprised of one of a static random access memory (SRAM) and a dynamic random access memory (DRAM).

* * * * *